United States Patent
Aoki

(10) Patent No.: US 7,894,772 B2
(45) Date of Patent: Feb. 22, 2011

(54) LOW DISTORTION RADIO FREQUENCY (RF) LIMITER

(75) Inventor: Ichiro Aoki, San Clemente, CA (US)

(73) Assignee: Axiom Microdevices, Inc., Woburn, MA (US)

( * ) Notice: Subject to any disclaimer, the term of this patent is extended or adjusted under 35 U.S.C. 154(b) by 615 days.

(21) Appl. No.: 11/771,106

(22) Filed: Jun. 29, 2007

(65) Prior Publication Data

US 2008/0031382 A1 Feb. 7, 2008

Related U.S. Application Data

(60) Provisional application No. 60/835,739, filed on Aug. 4, 2006.

(51) Int. Cl.
*H04B 1/00* (2006.01)

(52) U.S. Cl. ............... 455/63.1; 455/67.13; 455/114.1; 455/114.2; 455/114.3; 455/250.1; 330/252; 330/254; 330/296; 375/345; 375/346

(58) Field of Classification Search ............. 455/250.1, 455/501, 63.1, 67.13, 114.1–114.3; 330/252, 330/254, 296; 375/345, 346
See application file for complete search history.

(56) References Cited

U.S. PATENT DOCUMENTS

| 5,258,828 | A   |   | 11/1993 | Sano et al. |           |
|-----------|-----|---|---------|-------------|-----------|
| 6,414,547 | B1  | * | 7/2002  | Shkap       | 330/254   |
| 7,215,196 | B2  | * | 5/2007  | Banba et al.| 330/254   |
| 7,386,075 | B2  | * | 6/2008  | Mostov et al.| 375/345  |
| 2003/0181181 | A1 | * | 9/2003 | Darabi     | 455/250.1 |
| 2004/0075506 | A1 |   | 4/2004  | Welland et al. |       |
| 2004/0166815 | A1 |   | 8/2004  | Maligeorgos et al. |   |
| 2006/0164164 | A1 | * | 7/2006 | Rogers et al. | 330/252 |
| 2007/0188229 | A1 | * | 8/2007 | Abdelli    | 330/254   |

* cited by examiner

*Primary Examiner*—Edward Urban
*Assistant Examiner*—Junpeng Chen

(57) ABSTRACT

A limiter for minimizing an amount of phase change caused by input amplitude variation includes a variable gain amplifier configured to receive a signal having an amplitude component and a phase component and having a gain controlled by a compensation capacitance and a variable resistance, in which the compensation capacitance minimizes an effect of parasitic capacitance and the variable resistance adjusts a gain in the variable gain amplifier such that the amplitude component at an output of the variable gain amplifier remains substantially constant.

8 Claims, 8 Drawing Sheets

US 7,894,772 B2

LOW DISTORTION RADIO FREQUENCY (RF) LIMITER

CROSS REFERENCE TO RELATED APPLICATION

This application claims priority to co-pending U.S. provisional application entitled, "A Robust Low Delay, Replica Linearized Power Amplifier Implementation Using Corrective Feedback For Amplitude and Phase Control," having Ser. No. 60/835,739, filed on Aug. 4, 2006, and which is entirely incorporated herein by reference. This application is also related to co-pending, commonly assigned U.S. patent application entitled "System and Method For Low Delay Corrective Feedback Power Amplifier Control" having Ser. No. 11/771,130, filed on even date herewith; and co-pending, commonly assigned U.S. patent application entitled "Replica Linearized Power Amplifier" having Ser. No. 11/771,156, filed on even date herewith.

BACKGROUND

Portable communication devices such as cellular-type telephones or other communication devices are becoming more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device.

A portable communication device may employ a constant or a non-constant envelope modulation methodology. A non-constant envelope modulation scheme is typically implemented with a linear power amplifier. The entire amplitude and phase modulated waveform is provided to the input of the power amplifier and the power amplifier amplifies the combined signal. In a non-constant envelope modulation scheme, "power control" can be implemented as a "slow loop" regulating the gain of the power amplifier or adjusting the input amplitude to compensate for gain variation in the power amplifier that occurs due to process and temperature variations. Unfortunately, a linear power amplifier is significantly less efficient than a nonlinear power amplifier and, as such, consumes more power.

In the case where both a constant envelope modulation methodology and a non-constant envelope modulation methodology are employed, such as in a communication device that operates using the Global System for Mobile Communication (GSM) and the Enhanced Data Rates for GSM Evolution (EDGE) communication formats, the same power amplifier should be used for both signals. The GSM system provides a slightly higher output power and uses a constant-envelope modulation methodology. The EDGE system uses a non-constant-envelope modulation methodology. If a linear power amplifier is used to implement EDGE, then the power amplifier is less efficient when operated in GSM mode. This is why it is desirable to find a way to make a non-linear power amplifier work in EDGE mode.

Polar modulation is a known technique of performing non-constant envelope modulation using a nonlinear power amplifier. In polar modulation, a phase modulated input signal is applied to the radio frequency (RF) input to the power amplifier. The output power of the power amplifier is adjusted at the rate of the amplitude modulation to recompose the modulated waveform at the output of the power amplifier.

A GSM system has traditionally been implemented using a nonlinear power amplifier, with the "power control" implemented as a (slow) gain modulation in the power amplifier. A "power control" signal is supplied to the power amplifier from the baseband subsystem to implement the time-slotting (ramp up power at the beginning of the time slot, ramp it down at the end) of the communication protocol using this slow gain modulation. One prior attempt at implementing a power amplifier in the EDGE system using polar modulation increases the performance of the "power control" signal, so that the power amplifier output power can be changed rapidly to create the modulation and to create the power control (i.e. there is still the slow ramp up and ramp down at the edges of the slot, but the faster modulation is also added in the middle). In this manner, the power amplifier can still be used in GSM mode by applying a signal to the "power control" port with only the ramping signals, while also performing polar modulation in EDGE mode.

There are two kinds of polar modulation: open-loop and closed-loop. In open loop, there is no feedback path for the power amplifier output. In closed-loop, feedback on the amplitude and phase paths is used to measure the output amplitude and phase. The measured amplitude and phase are compared to a desired signal, and then an amplitude and gain correcting mechanism is used to minimize any discrepancy. Such an implementation is difficult while maintaining a very wide bandwidth, meeting noise requirements and preventing the system from becoming unstable and oscillating under output mismatch, for example, in the presence of a voltage standing wave ratio (VSWR).

In such a system, the phase modulation is typically applied directly to the signal input of the power amplifier. The phase can be controlled using a phase correction feedback loop. One of the challenges when implementing a so called "closed-loop polar modulation" technique is that the amplitude portion of the power amplifier output signal must be removed prior to providing the output signal to the phase correction loop.

A radio frequency (RF) limiter can be utilized in many applications where it is desirable to remove amplitude modulation from an input RF signal. Such applications can include the above-mentioned polar modulation, phase correction loops, phase modulation recovery, and other suitable applications. In polar modulation, a limiter can be used to remove amplitude modulation from an input RF signal while preserving the desired phase modulation for transmittal to a polar mode power amplifier. In a phase correction loop, a limiter can be used to remove amplitude modulation from an output signal for use in a phase correction feedback loop, such as to reduce the AM/PM distortion, which may otherwise occur in a phase detector utilized in the feedback loop. In such systems, it can be desirable for the limiter to reproduce the input phase accurately at the output over a wide range of input amplitude levels, so that a change in the input amplitude level does not alter the relationship between the input and output phase.

FIG. 1 is a schematic diagram illustrating a simplified prior art limiter 100. The limiter 100 comprises one or more variable gain amplifiers 101, an optional fixed-gain amplifier 102, an envelope detector 103, an optional buffer 104, and an error amplifier 105. The variable gain amplifiers 101, if more than one amplifier is used, can be connected in series with one another and can be of the same type or different types. The output of variable gain amplifier 101 is provided to an optional fixed-gain amplifier 102. The fixed-gain amplifier 102 can be used if the output of the variable gain amplifier 101 has less than desirable amplitude, such as to drive an envelope detector. The output of fixed-gain amplifier 102 is provided to an input of the envelope detector 103 and to an input of the optional buffer 104.

The envelope detector 103 responds to the amplitude of the signal output from the fixed-gain amplifier 102 and generates an envelope signal representing the detected amplitude. The envelope signal representing the detected amplitude is provided to the error amplifier 105. The error amplifier 105 compares the detected envelope signal with a signal representing a desired amplitude at its non-inverting input and generates a gain control signal which is provided to the variable gain amplifier 101. In an example in which multiple variable gain amplifiers are provided, each of the variable gain amplifiers 101 receives the same gain control signal. In another example, the variable gain amplifiers 101 can receive multiple gain control signals. The feedback loop closed by the error amplifier 105 can adjust the gains of variable gain amplifiers 101 in such a way as to keep the output of the detector 103 the same as the desired signal envelope resulting in a limited signal having no AM component. Optional buffer 104 can reproduce this signal to generate an output signal. If optional buffer 104 is omitted, the output of fixed-gain amplifier 102 or of variable gain amplifiers 101 can be used as the output signal.

FIG. 2 is a schematic diagram illustrating a prior art variable gain amplifier which can be used to implement the variable gain amplifier of FIG. 1. The variable gain amplifier 200 comprises an amplifying device in the form of an amplifying transistor 201, variable resistor 202, and load resistor 203. A capacitor 204 can represent an unwanted parasitic, which may be present in the circuit. The amplifying transistor 201 is configured to receive an RF input signal and is connected to the variable resistor 202 so that the resistance of the variable resistor 202 controls the gain of the RF input signal through amplifying device 201. The amplified signal is provided as the output of the variable gain amplifier 200. An example of the variable gain amplifier 200 can use a metal oxide semiconductor field effect transistor (MOSFET) device as the amplifying device 201. In such an example, the amplifying device 201 is configured so that the RF input signal is coupled to the gate terminal of the amplifying device 201 while the variable resistor 202 is connected to the source terminal of the amplifying device 201. Other configurations, such as using a bipolar transistor as an amplifying device 201, using compound devices such as cascode connected transistors for the amplifying device 201, or other suitable configurations are also possible. Optional load resistor 203 can be used to generate an output voltage from the current of amplifying device 201.

The capacitor 204 represents a common parasitic, or unwanted capacitance, which can be present. The capacitor 204 may be a junction capacitance associated with the amplifying device 201, capacitance of a metal trace on an integrated circuit (IC) or printed circuit board (PCB), a capacitance associated with the variable resistor 202, or another undesirable capacitance. The capacitance 204 can be detrimental if the variable gain amplifier 200 is constructed so that the gain of the amplifying device 201 is controlled by an impedance determined by both the variable resistor 202 and the capacitor 204. For example, if the capacitor 204 and the variable resistor 202 are each connected between the amplifying device 201 and an AC ground, the gain through amplifying device 201 can be inversely related to the input impedance of the variable resistor 202 in parallel with the capacitor 204. Since this impedance can be a complex number, the phase of the gain can be related to the phase of the complex number arctan(b/a) where a and b are the real and imaginary parts of the complex number, respectively. As the gain of the variable gain amplifier 201 is adjusted using the variable resistor 202, the phase of this impedance can change, causing AM/PM distortion. A representative example of such a phase change is illustrated in FIG. 3, in which the waveform 301 represents the phase of the impedance Z as the resistance value R of variable resistor 202 is changed.

Therefore, it is desirable to have an RF limiter that minimizes distortion.

SUMMARY

Embodiments of a circuit include a limiter for minimizing an amount of phase change caused by input amplitude variation. The limiter includes a variable gain amplifier configured to receive a signal having an amplitude component and a phase component and having a gain controlled by a compensation capacitance and a variable resistance, in which the compensation capacitance minimizes an effect of parasitic capacitance and the variable resistance adjusts a gain in the variable gain amplifier such that the amplitude component at an output of the variable gain amplifier remains substantially constant.

Related embodiments and methods of operation are also provided. Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to application in a portable transceiver, the low distortion RF limiter can be implemented in any device in which it is desirable to remove an amplitude modulation component from a signal.

Figure 1:
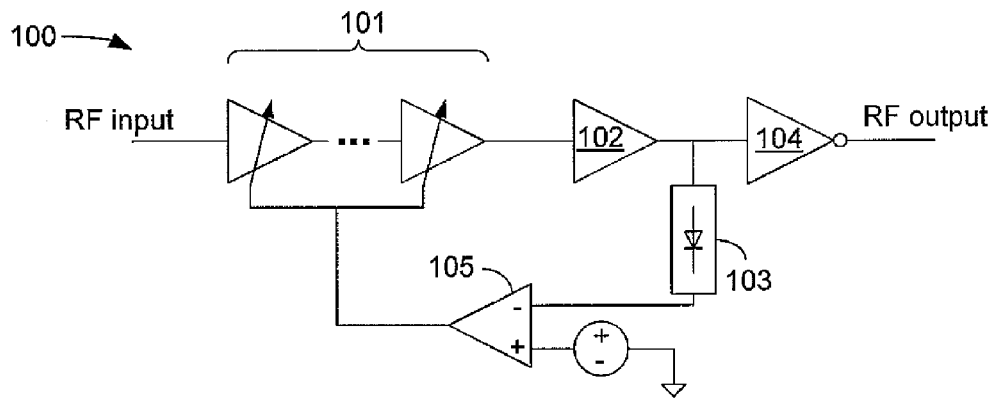
FIG. 1 is a block diagram illustrating a simplified prior art radio frequency (RF) limiter.
Figure 2:
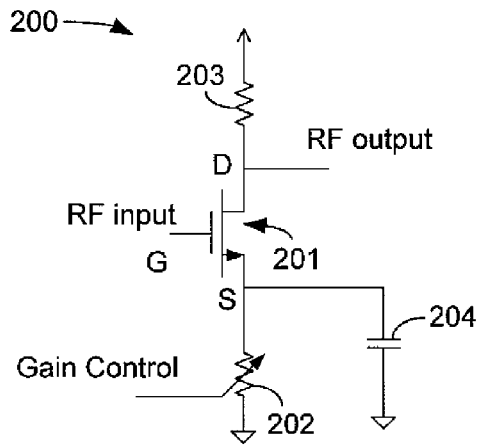
FIG. 2 is a schematic diagram illustrating a prior art variable gain amplifier which can be used to implement the variable gain amplifier of FIG. 1.
Figure 3:
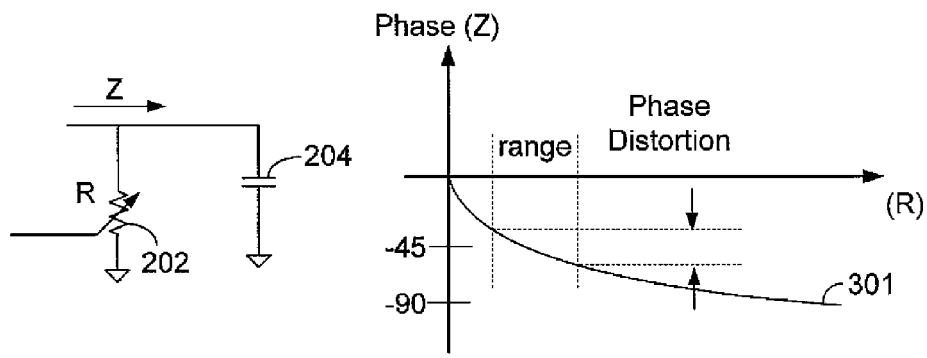
FIG. 3 is a graphical diagram illustrating a waveform that represents the phase of the impedance Z as the resistor value R of the variable resistor of FIG. 2 is changed.
Figure 4:
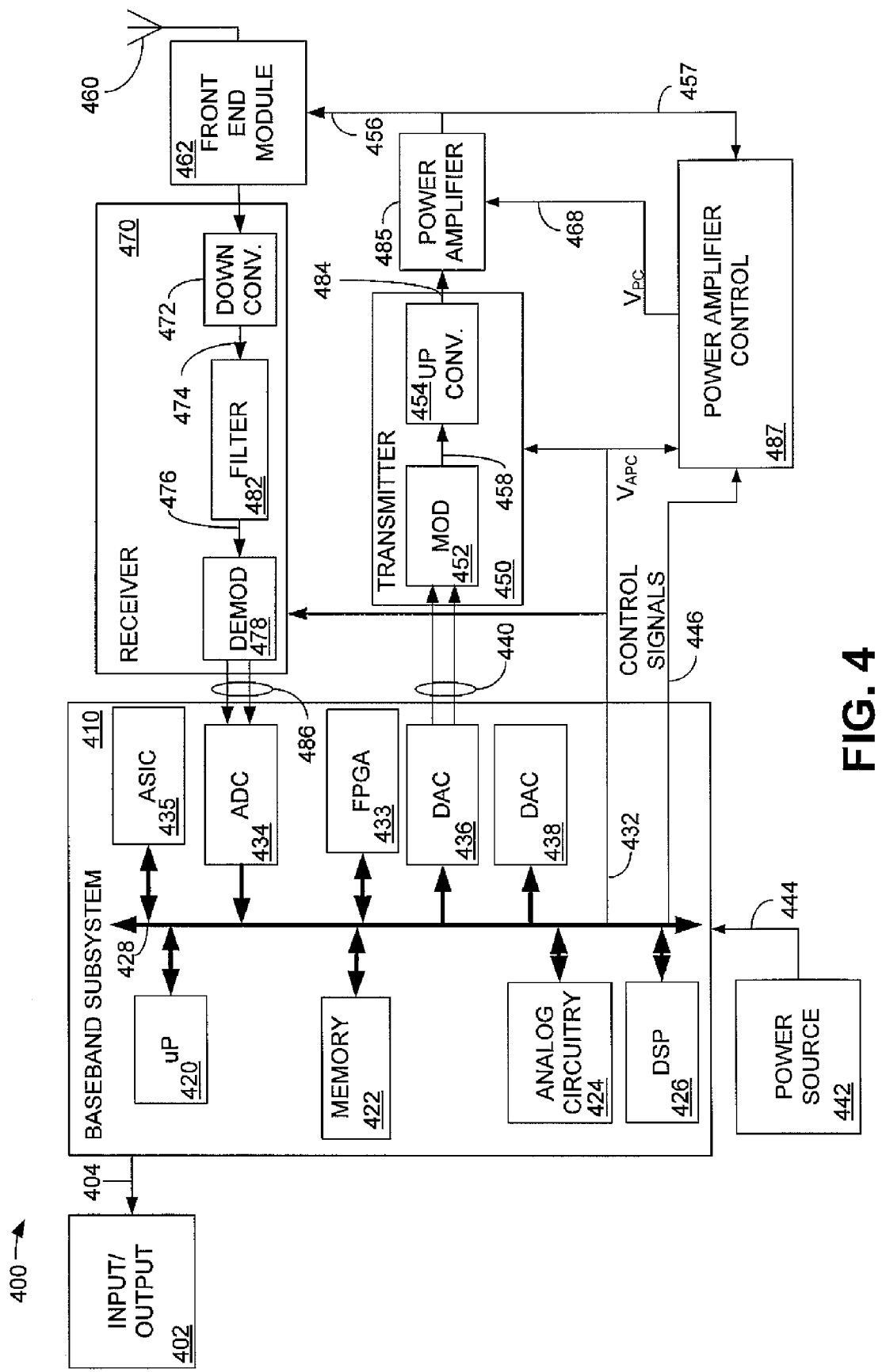
FIG. 4 is a block diagram illustrating a simplified portable transceiver including an embodiment of a low distortion RF limiter.

FIG. 4 is a block diagram illustrating a simplified portable transceiver 400 including an embodiment of a low distortion RF limiter. The portable transceiver 400 includes an input/output (I/O) module 402. Depending on the type of portable transceiver, the input/output module 402 may include a speaker, a display, a keyboard, a microphone, a trackball, a touch pad, or any other user interface device. A power source 442, which may be a direct current (DC) battery or other power source, is also connected to the baseband subsystem 410 via connection 444 to provide power to the portable transceiver 400. In a particular embodiment, portable transceiver 400 can be, for example but not limited to, a portable telecommunication device such as a mobile cellular-type telephone. The power source 442 might be connected directly to other parts of the transceiver as well, for example the receiver 470, the transmitter 450, and/or the power amplifier 485.

The baseband subsystem 410 includes a microprocessor (μP) 420, a memory 422, analog circuitry 424, and digital signal processor (DSP) 426 in communication via bus 428. Bus 428, although shown as a single bus, may be implemented using multiple busses connected to provide a physical connection and a logical connection among the subsystems within baseband subsystem 410.

Depending on the manner in which the low distortion RF limiter is implemented, the baseband subsystem 410 may also include one or more of an application specific integrated circuit (ASIC) 435 and a field programmable gate array (FPGA) 433.

Microprocessor 420 and memory 422 provide the signal timing, processing and storage functions for portable transceiver 400. Analog circuitry 424 provides the analog processing functions for the signals within baseband subsystem 410. Baseband subsystem 410 provides control signals to transmitter 450, receiver 470 power amplifier 485 and the power amplifier control element 487 such as through connection 432 for example.

The baseband subsystem 410 generates a power control signal that includes an amplitude-modulation (AM) component and provides the AM signal on connection 446 to the power amplifier control element 487. In practice, the functions of generating the power control signal and the AM signal can alternatively be integrated within other parts of the transceiver as well, for example in the transmitter 450 or in the power amplifier control element 487. The power control signal can be referred to as $V_{APC}$. The power control signal, $V_{APC}$, can be generated by the baseband subsystem 410 and can be converted to an analog control signal by the digital-to-analog converter (DAC) 438. The power control signal, $V_{APC}$, is illustrated as being supplied from the bus 428 to indicate that the signal may be generated in different ways as known to those skilled in the art. The power control signal, $V_{APC}$, is a reference voltage signal that defines the transmit power level and provides the power profile. Generally, the power control signal, $V_{APC}$, controls the power amplifier as a function of the peak voltage of the power amplifier determined during calibration, and corresponds to power amplifier output power. In some embodiments the power control signal might be in the form of a current or a digital signal rather than an analog voltage.

The control signals on connections 432 and 446 may originate from the DSP 426, the ASIC 435, the FPGA 433, or from microprocessor 420, and are supplied to a variety of connections within the transmitter 450, receiver 470, power amplifier 485, and the power amplifier control element 487. It should be noted that for simplicity, only the basic components of the portable transceiver 400 are illustrated herein. The control signals provided by the baseband subsystem 410 control the various components within the portable transceiver 400. Further, the function of the transmitter 450 and the receiver 470 may be integrated into a transceiver.

Baseband subsystem 410 also includes analog-to-digital converter (ADC) 434 and digital-to-analog converters (DACs) 436 and 438. In this example, the DAC 436 generates the in-phase (I) and quadrature-phase (Q) signals 440 that are applied to the modulator 452. Other embodiments are possible, for example by utilizing direct modulation of a phase locked loop (PLL) synthesizer or direct digital synthesizer (DDS). These methods are well-know to those skilled in the art. In this example the DAC 438 generates the power control signal, $V_{APC}$, on connection 446. ADC 434, DAC 436 and DAC 438 also communicate with microprocessor 420, memory 422, analog circuitry 424, DSP 426 and FPGA 433 via bus 428. DAC 436 converts the digital communication information within baseband subsystem 410 into an analog signal for transmission to a modulator 452 via connection 440. Connection 440, while shown as two directed arrows, includes the information that is to be transmitted by the transmitter 450 after conversion from the digital domain to the analog domain.

The transmitter 450 includes modulator 452, which modulates the analog or digital information on connection 440 and provides a modulated signal via connection 458 to upconverter 454. The upconverter 454 transforms the modulated signal on connection 458 to an appropriate transmit frequency and provides the up converted signal to a power amplifier 485 via connection 484. In alternative embodiments, the modulator 452 and the upconverter 454 can be combined into a single element that provides both functions simultaneously. The power amplifier 485 amplifies the signal to an appropriate power level for the system in which the portable transceiver 400 is designed to operate.

Details of the modulator 452 and the upconverter 454 have been omitted, as they will be understood by those skilled in the art. For example, the data on connection 440 is generally formatted by the baseband subsystem 410 into in-phase (I) and quadrature (Q) components. The I and Q components may take different forms and be formatted differently depending upon the communication standard being employed. For example, when the power amplifier 485 is used in a constant-amplitude, phase (or frequency) modulation application such as the global system for mobile communications (GSM), the phase modulated information is provided by the modulator 452. When the power amplifier 485 is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 452, while the amplitude modulation is performed by the power amplifier control element 487, where the amplitude envelope is defined by the PA power control voltage $V_{PC}$, which is generated by the power amplifier control element 487. This technique is known as polar modulation.

The power amplifier 485 supplies the amplified signal via connection 456 to a front end module 462. The front end module 462 comprises an antenna system interface that may include, for example, a diplexer having a filter pair that allows simultaneous passage of both transmit signals and receive signals, as known to those having ordinary skill in the art. The transmit signal is supplied from the front end module 462 to the antenna 460.

A signal received by antenna 460 will be directed from the front end module 462 to the receiver 470. The receiver 470 includes a downconverter 472, a filter 482, and a demodulator 478. If implemented using a direct conversion receiver (DCR), the downconverter 472 converts the received signal from an RF level to a signal centered around baseband frequency (DC), or a near-baseband frequency (~100 kHz). Alternatively, the received RF signal may be downconverted to an intermediate frequency (IF) signal, depending on the application. The downconverted signal is sent to the filter 482 via connection 474. The filter comprises a least one filter stage to filter the received downconverted signal as known in the art.

The filtered signal is sent from the filter 482 via connection 476 to the demodulator 478. The demodulator 478 recovers the transmitted analog information and supplies a signal representing this information via connection 486 to ADC 434. ADC 434 converts these analog signals to a digital signal at baseband frequency and transfers the signal via bus 428 to DSP 426 for further processing.

Figure 5:
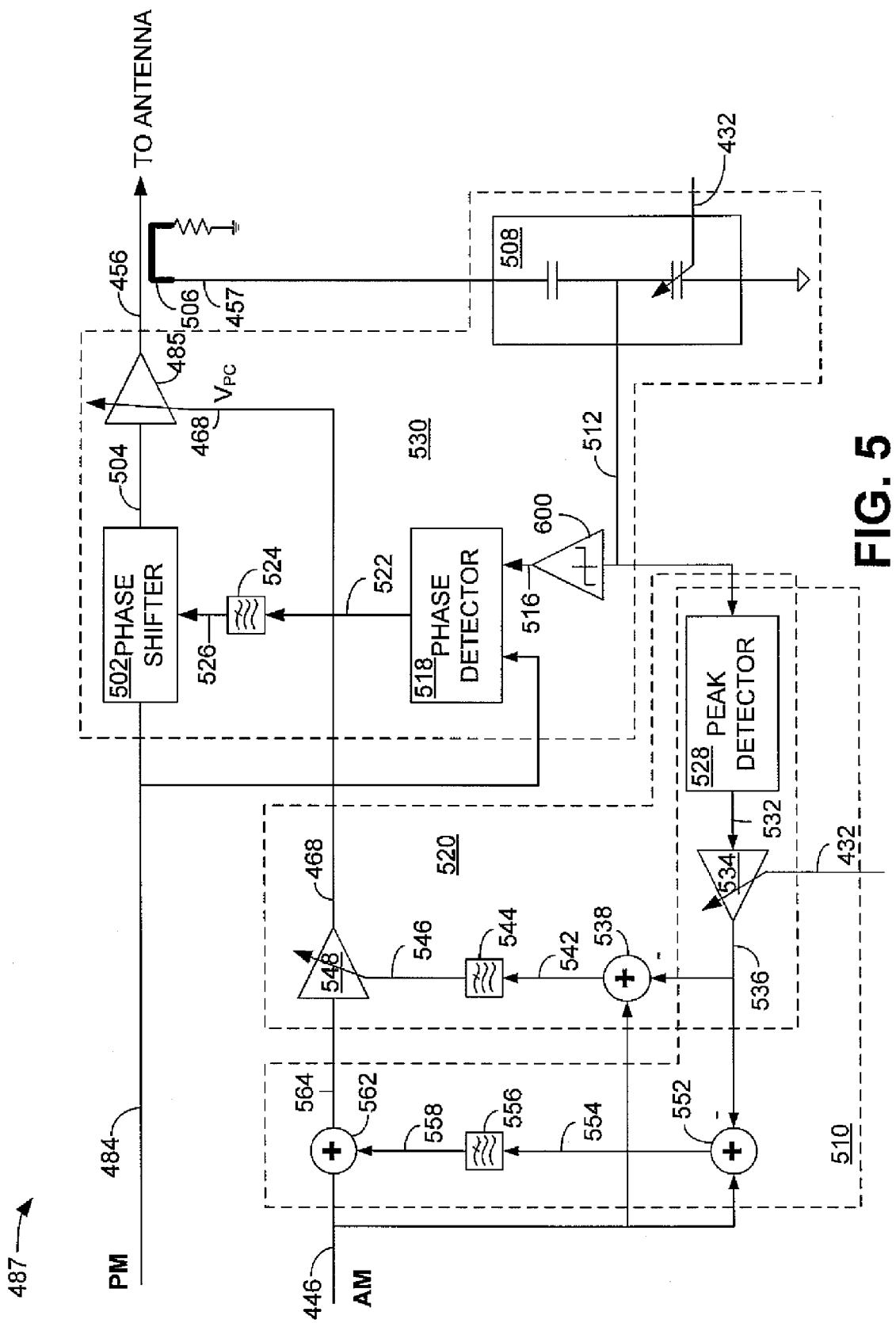
FIG. 5 is a block diagram illustrating an embodiment of the power amplifier control element of FIG. 4 including an embodiment of a low distortion RF limiter.

FIG. 5 is a block diagram illustrating an embodiment of the power amplifier control element 487 of FIG. 4. The power amplifier control element 487 controls the power output of the power amplifier 485, which receives a phase modulated (PM) signal via connection 484 and an amplitude modulation (AM) control signal via connection 446. In this embodiment, the AM and PM are independently controlled and are combined in the power amplifier circuitry. The AM signal on connection 446 is provided via the baseband subsystem 410 (FIG. 4) and is used as a control signal which impresses the AM on the control port of the power amplifier 485. The AM signal is used to control the power output of the power amplifier 485. The PM signal on connection 484 is a signal comprising a low-frequency phase modulation of the radio frequency RF carrier supplied to the RF input of the power amplifier 485.

However, applying the amplitude modulation to the control port of the power amplifier 485 can distort the phase portion of the signal through the power amplifier 485, such as if the phase delay of the power amplifier 485 changes with the control signal or the output level. Additionally, the output amplitude can be distorted relative to the desired output amplitude if the output amplitude of the power amplifier 485 does not accurately track the control signal 468. To minimize these phase and amplitude distortions, the power amplifier control element 487 comprises a phase correction loop (phase loop) 530 in addition to an outer AM correction loop (outer AM loop) 510 and an inner AM correction loop (inner AM loop) 520. The inner and outer AM correction loops improve the linearity of the AM control of the power amplifier 485. The bandwidth of the outer AM correction loop 510 is larger than the bandwidth of the inner AM correction loop 520 by an approximate magnitude of 10. In an example using the EDGE modulation spectrum, the bandwidth of the outer AM correction loop 510 is approximately 2 megahertz (MHz) and the bandwidth of the inner AM correction loop 520 is approximately 200 kilohertz (kHz). The bandwidth of the phase correction loop 530 is approximately 2 MHz. The approximate decade difference between the outer AM correction loop 510 and the inner AM correction loop 520 helps to maintain the stability of the power amplifier control element 487.

In an embodiment, the power amplifier 485 is implemented using a power amplifier device having a linearized control circuit and methodology, which linearizes the amplitude control characteristic of the power amplifier 485. This power amplifier is also referred to as a "replica-corrected power amplifier."

In an embodiment, the power amplifier 485, the outer AM correction loop 510, the inner AM correction loop 520 and the phase correction loop 530 are implemented on the same semiconductor die. In this manner, the response of the components is similar with respect to process and temperature variations.

A portion of the output of the power amplifier 485 on connection 456 is coupled, by using, for example, an RF coupler 506 to connection 457. Alternately, other couplings can be used, such as a direct connection, capacitive division, voltage sense, current sense, or other couplings or combinations of couplings. The RF signal on connection 457 is provided to a variable attenuator 508. The variable attenuator 508 is controlled by a signal from the baseband subsystem 410 via connection 432. The control signal on connection 432 controls the amount of attenuation provided by the variable attenuator 508. The output of the variable attenuator 508 is provided via connection 512.

The outer AM correction loop 510 comprises a peak detector 528, a baseband variable gain amplifier (VGA) 534, an adder 552, a low pass filter 556 and an adder 562. The output of the variable attenuator on connection 512 is coupled to the peak detector 528. The peak detector 528 removes the RF portion of the signal from connection 512 and provides via connection 532 to the baseband VGA 534 a baseband signal that is proportional to the AM envelope of the RF signal on connection 512. The baseband VGA 534 is controlled by a signal via connection 432 from the baseband subsystem 410. The baseband VGA 534 adjusts the gain of the signal at connection 532 and provides an output via connection 536. The output of the baseband VGA 534 on connection 536 is provided to an adder 552. Another input to the adder 552 is the AM control signal on connection 446. The signal on connection 536 is subtracted from the AM control signal on connection 446 and the output of the adder 552 is provided via connection to 554 to the low pass filter 556. The low pass filter 556 may be a passive device or an active device having a frequency response and a gain value. The output of the low pass filter 556 on connection 558 is combined with the AM control signal on connection 446 in the adder 562. The output of the adder 562 is provided via connection 564 to the inner AM control loop 520.

The outer AM correction loop 510 operates at a wide bandwidth (in this example approximately 2 MHz) compared to the inner AM correction loop 520 and can correct offsets, and distortion that can exist in the forward path through the power amplifier 485. The outer AM correction loop 510 also linearizes the control loop and corrects any AM control nonlinearity present in the power amplifier 485.

The inner AM correction loop 520 includes the peak detector 528, baseband VGA 534, an adder 538, a low pass filter 544 and a VGA 548. While the baseband VGA 534 and the VGA 548 are shown as amplifiers, the baseband VGA 534 and the VGA 548 can be any variable gain elements. The output of the baseband VGA 534 on connection 536 is also provided to an adder 538. Another input to the adder 538 is the AM control signal on connection 446. The signal on connection 536 is subtracted from the signal on connection 446 and provided as an output of the adder 538 on connection 542. The signal on connection 542 is provided to the low pass filter 544, the output of which on connection 546 is used to control the gain of the VGA 548. The low pass filter 544 may be a passive device or an active device having a frequency response and a gain value. The input to the VGA 548 is taken from the output of the adder 562. This signal on connection 564 represents the AM signal on connection 446 as corrected by the outer AM correction loop 510. The output of the VGA 548 on connection 468 is the control signal that is applied to the control port of the power amplifier 485 and includes the AM portion of the transmit signal. In this manner, the AM control signal on connection 446 is used to control the output power of the power amplifier 485 and is also used to impress the AM portion of the transmit signal.

The inner AM correction loop 520 employs multiplicative corrective feedback to allow the VGA 548 to compensate for gain changes in the forward path. The gain changes in the forward path may occur due to, for example, changing VSWR, etc. The outer AM correction loop 510 employs linear corrective feedback to correct offset and non-linearity in the forward path. The inner AM correction loop 520 maintains a constant bandwidth in the outer AM correction loop 510 by forcing the outer AM correction loop 510 to have a constant gain. Therefore, any impedance change at the output of the power amplifier 485, or any electrical change that affects the gain in the forward path, is canceled by the VGA 548. This forces the gain and bandwidth of the outer AM correction loop 510 to be constant. In this example, the bandwidth of the inner AM correction loop 520 is approximately 200 kHz. The VGA 548 maintains the bandwidth of the outer AM correction loop 510 at a constant value to maintain high bandwidth in AM correction loop 510 while maintaining loop stability.

Even if the control input to the power amplifier 485 were to remain constant, changes that affect the output load of the power amplifier 485 would change the gain of the RF signal through the power amplifier 485, and thus change the gain between the control signal 468 and the detected signal 536. The correction bandwidth of the outer AM correction loop 510 can be proportional to the gain of the feedback loop, including the gain through the power amplifier 485 and the VGA 548. Additionally, the stability of the outer AM correction loop 510 can be compromised if the loop gain is too high. Thus, it is important to keep the loop gain sufficiently high so as to correct any AM distortion, while keeping the loop gain low enough so as to ensure stability. Therefore the VGA 548 is used to correct gain variations in the power amplifier 485, maintaining a constant overall loop gain for the outer AM correction loop 510. Thus, using the inner AM correction loop 520 as a corrective feedback path allows stable control without restricting overall system bandwidth.

Due to the placement of the low pass filters 556 and 544 in the feedback paths instead of in the forward path, the forward bandwidth from the AM input signal on connection 446 to the power amplifier output on connection 456 is nearly independent of the response of both the inner and outer AM correction loops and is dependent only on the bandwidth of the power amplifier. In this manner, the feedback is corrective and not integrated, so changes to the forward path are made with a very low delay. The high bandwidth and low signal delay provided by the inner and outer AM correction loops provide accurate control of the power output of the power amplifier 485 using the VGA 548 and provide a highly linear control through the wide bandwidth outer AM correction loop 510.

The phase correction loop 530 includes the variable attenuator 508, a limiter 600, phase detector 518, a low pass filter 524 and a phase shifter 502. The output signal of the variable attenuator on connection 512 is provided to a limiter 600. The limiter 600 removes the AM portion of the signal from the output on connection 512 and provides an input to the phase detector 518. The limiter 600 operates with low phase distortion and will be described in greater detail below. The other input to the phase detector 518 is the PM signal on connection 484. The phase detector 518 determines a difference between the phase of the signal on connection 516 and the phase of the signal on connection 484 and provides an error signal on connection 522 representing the difference. The error signal is provided to the low pass filter 524, which provides an output to the phase shifter on connection 526. The signal on connection 526 determines the extent to which the phase shifter 502 will shift the phase of the input signal on connection 484 and provide an appropriate PM input signal to the power amplifier 485 via connection 504.

The variable attenuator 508 provides coarse power control. By varying the attenuation of the feedback signal on connection 457, the variable attenuator 508 can control the output power of the power amplifier 485 through the outer AM correction loop 510. The variable attenuator 508 also maximizes the range of the peak detector 528 range by keeping the operating point of the peak detector 528 relatively constant. The output power of the power amplifier 485 will settle to a level set by the outer AM correction loop 510. The baseband control signal on 432 determines the gain of the baseband VGA 534 and the closed loop control maintains the output of the baseband VGA 534 equal to the AM signal on connection 446. In an embodiment, the feedback signal to the AM correction loops and the phase correction loop is provided from separate variable attenuators.

The AM control signal provided to the power amplifier 485 via connection 468 may change the phase delay characteristics of the power amplifier 485 and induces a phase change. One mechanism which can cause this effect is that the change in output power induced by the change in the control signal 468 can cause the phase delay to change due to an AM/PM conversion mechanism in the power amplifier 485. The phase correction loop 530 provides a retarded or advanced phase of the signal on connection 484 to power amplifier 485 based on the error signal from the phase detector 518. The corrective characteristics of the phase detector 518 are encompassed by the bandwidth of the inner and outer AM correction loops. The phase correction loop 230 does not alter the phase of the signal on connection 484 if phase distortion is not present.

The power amplifier 485, phase correction loop 530, the outer AM correction loop 510 and the inner AM correction loop 520 can be fabricated on the same semiconductor die. In this manner, the response of the components will be closely matched with respect to temperature and process.

Figure 6:
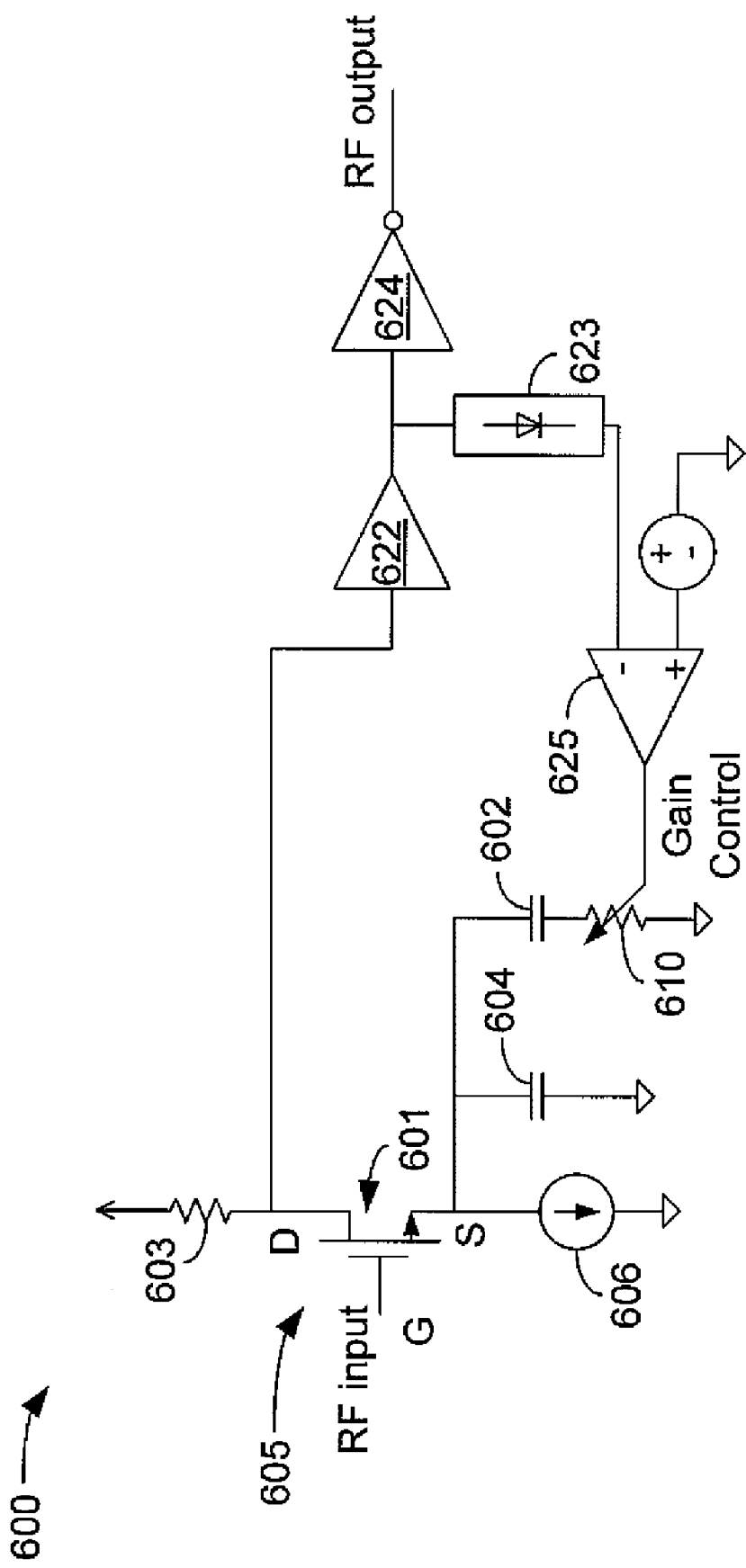
FIG. 6 is a schematic diagram of an embodiment of a low distortion RF limiter, implemented using a variable gain amplifier.

FIG. 6 is a schematic diagram of a low distortion RF limiter 600, implemented with a variable gain amplifier in accordance with an embodiment of the present invention. The variable gain amplifier 605 may be used to reduce AM/PM distortion in the limiter 600. The variable gain amplifier 605 comprises an amplifying device 601, a variable resistance, illustrated as a variable resistor 610, a compensation capacitor 602, an optional load resistor 603, and an optional bias current 606. The capacitor 604 represents an unwanted parasitic capacitance, which may be present in the circuit, an intentionally placed capacitance, or a combination of parasitic and intentionally placed capacitance.

The amplifying device 601 is configured to receive an RF input signal and is coupled to the variable resistor 610 so that the resistance of the variable resistor 610 can control the gain of the RF input signal through the amplifying device 601. The output of the amplifying device 601 can be provided to an optional fixed-gain amplifier 622. Although a single variable gain amplifier 605 is shown in FIG. 6 for simplicity, several variable gain amplifiers 605 can be used in series as mentioned above. The fixed-gain amplifier 622 can be used if the output of the variable gain amplifier 605, or amplifiers if a plurality of variable gain amplifiers are implemented, has less than desirable amplitude, such as to drive an envelope detector. The output of fixed-gain amplifier 622 is provided to an input of the envelope detector 623 and to an input of the optional buffer 624. The envelope detector 623 responds to the amplitude of the signal output from the fixed-gain amplifier 622 and generates an envelope signal representing the detected amplitude. The envelope signal representing the detected amplitude is provided to an error amplifier 625. The error amplifier 625 compares the detected envelope signal with a signal representing a desired amplitude and generates a gain control signal which is provided to the variable resistance 610 in the variable gain amplifier 605. In this way, the gain of the variable gain amplifier 605, or amplifiers, can be adjusted to keep the amplitude at the RF output nearly equal to the desired amplitude. The amplified signal is provided as the RF output of the limiter 600.

An optional current source 606 can be used to provide dc bias to the amplifying device 601. An optional load resistor 603 can be used to generate an output voltage from the current provided by the amplifying device 601. Alternately, a current from the amplifying device 601 may be used as the output or other suitable load networks may be used to provide an output voltage from the amplifying device 601.

The compensation capacitor 602 is coupled to the amplifying device 601 and to the variable resistor 610 so that its capacitance value can modify the relationship between the resistance of the variable resistor 610 and the phase of the gain through the amplifying device 601. This is accomplished by modifying the impedance presented to the amplifying device 601 by the combination of the capacitance 604, the compensation capacitance 602 and the variable resistor 610. In an embodiment, the compensation capacitor 602 is placed in series with the variable resistor 610 so that there is a series path between the amplifying device 610 and an ac ground. By appropriately choosing the value of the compensation capacitor 602 relative to the resistance range of the variable resistor 610 and the capacitor 604, the phase of the impedance presented by the combination of the capacitance 604, the compensation capacitance 602 and the variable resistor 610 can have reduced variation over a desired range of gain settings.

In an embodiment, in which the variable resistor 610 and capacitor 602 are coupled in series with each other such that the series combination of the variable resistor 610 and the compensation capacitor 602 is coupled in parallel with the capacitor 604, the optimal capacitance $C_S$ of the compensation capacitor 602 can be calculated using the following equation:

$$C_S = \frac{1}{2\pi f_0 R_{opt}} \left( \frac{1 + \sqrt{1 + 4K^2}}{2K} \right)$$

where:

$$K = 2\pi f_0 R_{opt} C_P$$

and where $f_0$ is an operating frequency, $C_P$ is the capacitance of the capacitor 604 and $R_{opt}$ is a resistance value in the range of the variable resistor 610. This equation indicates a capacitance value for the compensation capacitor 602 such that the AM/PM distortion can be reduced substantially to zero at an operating frequency $f_0$ when the variable resistor 610 assumes a resistance value near $R_{opt}$. In this manner, the compensation capacitor 602 and the variable resistance 610 maintain the phase delay of the amplifying device 601 as nearly constant as the gain is adjusted, thereby maintaining constant phase delay through the limiter even as the gain is being constantly adjusted to remove the AM signal component. As the input amplitude to the variable gain amplifier 605 changes, the gain of the variable gain amplifier 605 is constantly adjusted by the variable resistance 610 in the feedback path to remove the AM, so as to provide a constant amplitude component to the signal at the output of the detector.

Figure 7:
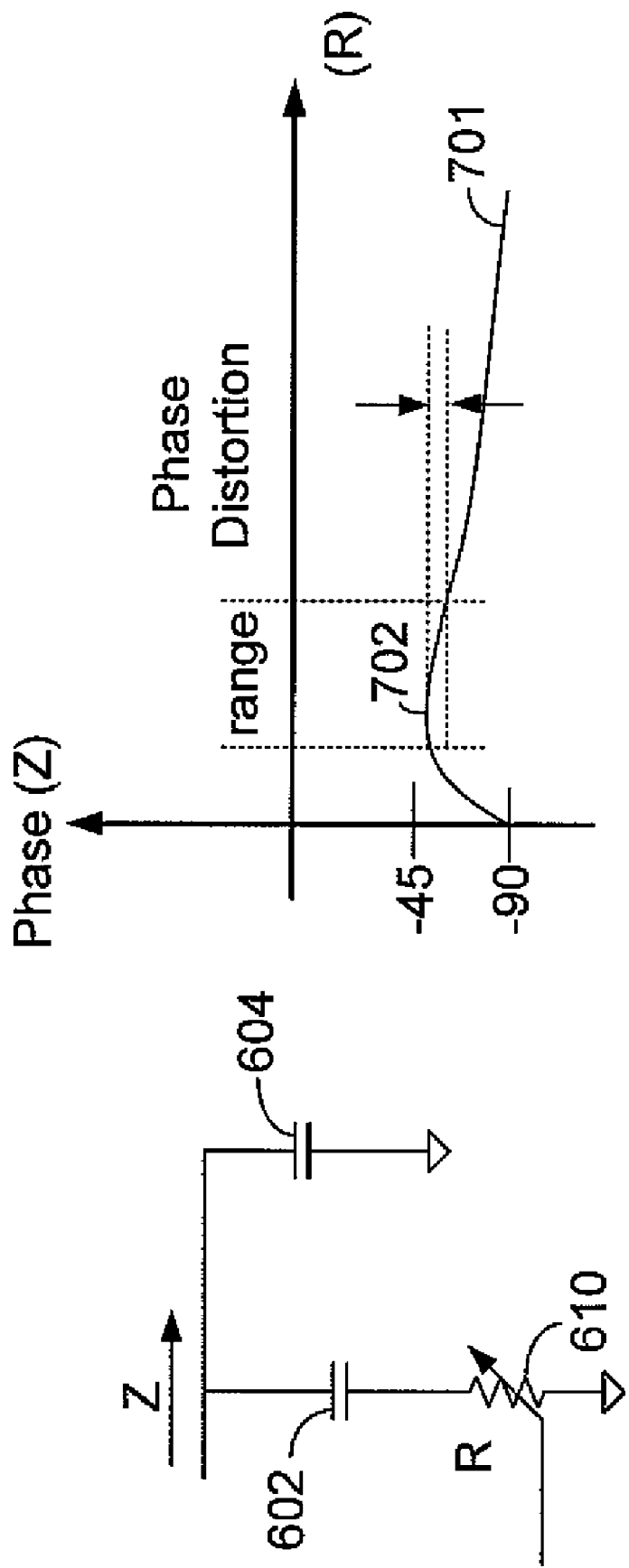
FIG. 7 is a graphical diagram illustrating a waveform that represents the phase of the impedance Z as the resistor value R of the variable resistor of FIG. 6 is changed.

A representative diagram of this effect is shown in FIG. 7, in which the waveform 701 depicts an exemplary phase of the impedance Z as the resistance R of variable resistor 610 is changed. In the example of FIG. 7, the component values have been chosen to minimize the AM/PM distortion at a value for resistance R within the range 702.

Figure 8:
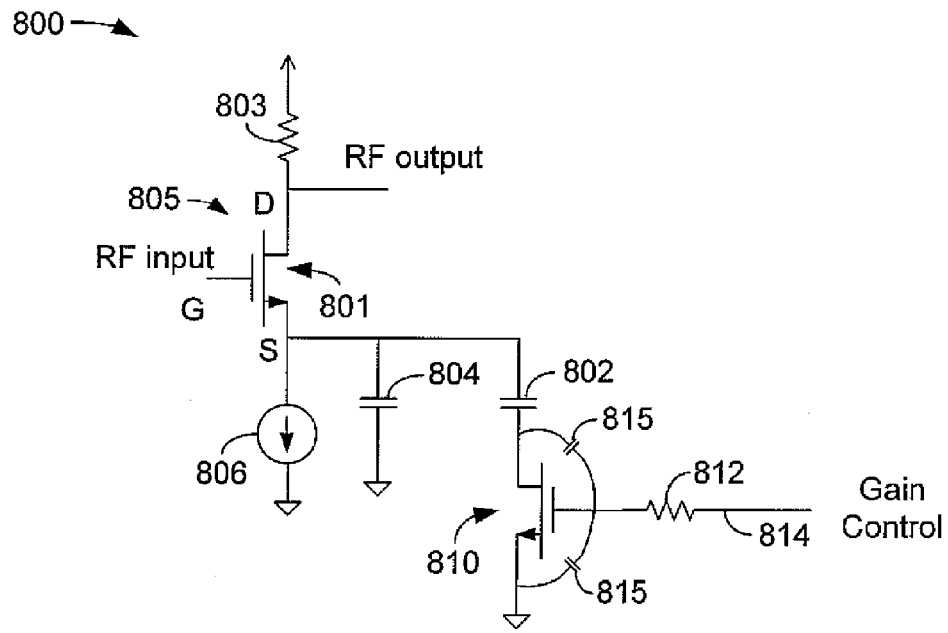
FIG. 8 is a schematic diagram of an embodiment of a variable gain amplifier having reduced sensitivity to transistor parasitic capacitance.

FIG. 8 is a schematic diagram illustrating an embodiment of a variable gain amplifier 805 having reduced sensitivity to transistor parasitic capacitance. The elements in FIG. 8 that are similar to the elements in FIG. 6 will be referred to using the nomenclature 8XX in which XX denotes the same element from FIG. 6. For example, the compensation capacitor 602 in FIG. 6 will be referred to as the compensation capacitor 802 in FIG. 8.

The variable gain amplifier 805 may be used to reduce AM/PM distortion in a limiter. In the variable gain amplifier 805, a field effect transistor (FET) 810 implements a variable resistance, which is coupled to an amplifying device 801 through the compensation capacitor 802. The FET 810 is used to control the gain through the amplifying device 801. In this example, the amplifying device 810 can be a metal-oxide field effect transistor (MOSFET) or other suitable FET. In one embodiment, the transistor 810 is used in its triode region so that the transistor 810 can act as a variable resistance having a resistance that varies with the gate voltage applied to the transistor 810 on connection 814. In this manner, the resistance of the transistor 810 is adjustable. An optional resistance 812 can be placed in series with the gate connection to isolate RF signals between the gain control input and the transistor 810.

Use of a FET 810 to implement a variable resistor in a variable gain amplifier can be advantageous due to the low cost associated with implementation of transistors compared to implementing variable resistors. In an embodiment, the amplifying device 801 and the field effect transistor 810 can be implemented together on an integrated circuit, such as a complementary metal-oxide semiconductor (CMOS) integrated circuit.

A characteristic of implementing the variable resistance 810 as a FET can be the additional parasitic capacitances 815 which may be introduced. For instance, if the FET 810 is a MOSFET, gate capacitance 815 can be introduced into the circuit and can behave as parasitic capacitances. The parasitic gate capacitance 815 can result in additional AM/PM distortion.

Figure 9:
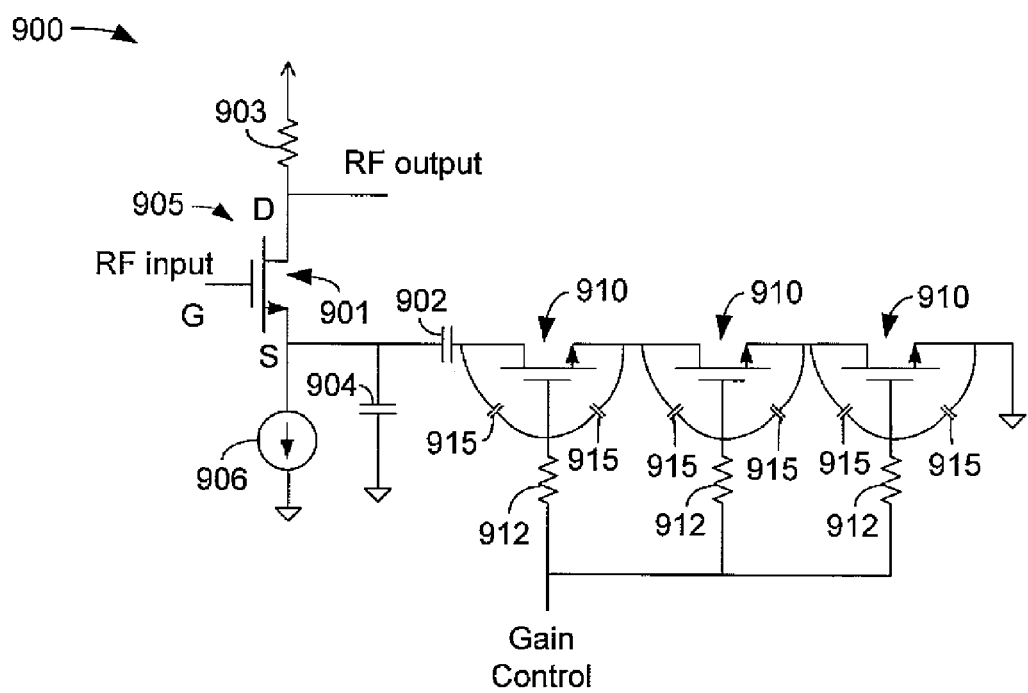
FIG. 9 is a schematic diagram of an alternative embodiment of a variable gain amplifier having reduced sensitivity to transistor parasitic capacitance.

FIG. 9 is a schematic diagram of a variable gain amplifier 905 having reduced sensitivity to transistor parasitic capacitance in accordance with an embodiment of the invention. The elements in FIG. 9 that are similar to the elements in FIG. 6 and FIG. 8 will be referred to using the nomenclature 9XX in which XX denotes the same element from FIG. 6 or FIG. 8.

For example, the compensation capacitor 602 in FIG. 6 will be referred to as the compensation capacitor 902 in FIG. 9.

The variable gain amplifier 905 may be used to reduce AM/PM distortion in a limiter. In this embodiment, a number of field effect transistors 910 are connected in series implementing a variable resistor coupled to the amplifying device 901. The FETs 910 can together implement a variable resistance by applying adjustment voltage to their gates, such as by using resistors 912. In an embodiment, the FETs 910 can each be operated in the triode region to each implement a resistance controlled by their respective gate-source voltages. By adjusting the resistance presented to the amplifying device 901 by the FETs 910, the gain through the amplifying device 901 can be controlled. The use of series-connected FETs 910 can have an advantage over a single FET 810 (FIG. 8) by reducing the effect of the parasitic capacitance 915 associated with the FETs 910 relative to the parasitic capacitance 815 of the FET 810.

The resistance of a FET is related to the effective length of the channel of the device divided by the effective width of the channel of the device. Accordingly, if the FET 810 is implemented with an effective channel width W and an effective channel length L, then the FETs 910 can each be implemented to generate a similar resistance using the same effective channel width W and an effective channel length L/N, where N is the number of FETs 910 used. Assuming that the parasitic capacitance is proportional to the device area, then the parasitic capacitance 915 of each FET 910 can be N times less than the parasitic capacitance 815 of the FET 810. Further, the several parasitic capacitances 915 are connected in series with each other, resulting in an effective capacitance occurring in parallel with the FETs 910, which can be N squared times less than the effective capacitance that the parasitic capacitance 815 presents in parallel with the FET 810.

This reduction in the effect of the parasitic capacitance 915 can be reduced if the gates of the FETs 910 are connected directly together. This can be avoided by placing a resistor 912 in series with each of the gates of the FETs 910 such that each gate is separated from each other gate by at least one resistor 912. In an embodiment, each gate can be connected to a gain control voltage by a different resistor 912. The number of transistors 910 and resistors 912 that can be used is dependent on the amount of area available on the semiconductor die, with phase distortion performance typically increasing as the number is increased. Moreover, the resistors 912 can have different values.

Figure 10:
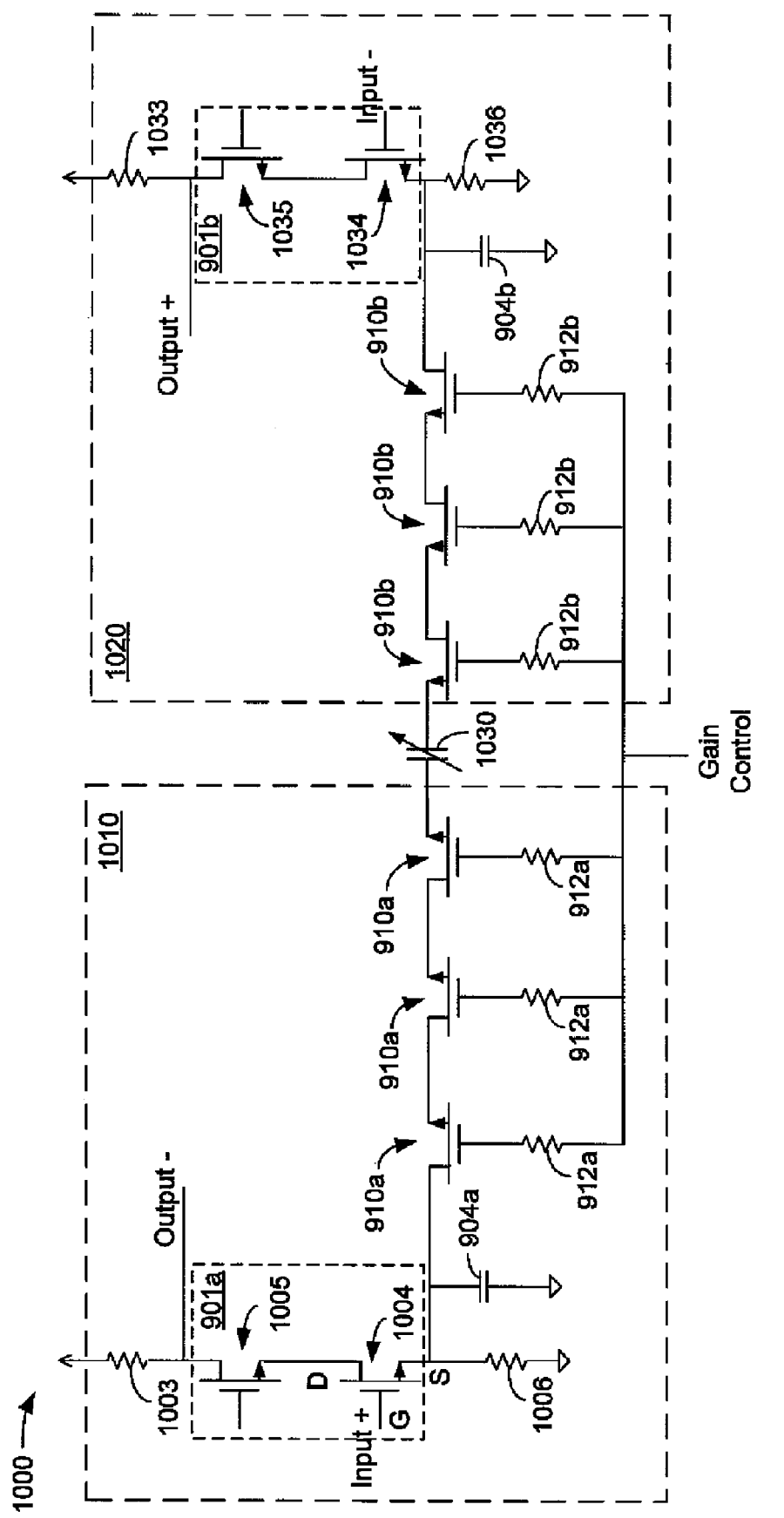
FIG. 10 is a schematic diagram of an embodiment of a differential variable gain amplifier.

FIG. 10 is a schematic diagram of a differential variable gain amplifier 1000 in accordance with an exemplary embodiment of the present invention. The differential variable gain amplifier 1000 may be used to reduce AM/PM distortion in a limiter. The differential variable gain amplifier 1000 comprises an amplifying section 1010, an amplifying section 1020 and a variable capacitance, implemented as a variable capacitor 1030. The amplifying section 1010 is configured to receive a non-inverted RF input signal and to output an inverted RF output signal. The amplifying section 1020 is configured to receive an inverted RF input signal and to output a non-inverted RF output signal.

The amplifying section 1010 comprises an amplifying device 901a, FETs 910a, resistors 912a, an optional load resistor 1003, and an optional bias resistor 1006. A capacitor 904a represents an unwanted parasitic capacitance, which may be present in the circuit, an intentionally placed capacitance, or a combination of parasitic and intentionally placed capacitance.

The amplifying device 901a is configured to receive the non-inverted RF input signal and is coupled to FETs 910a so that the resistance of the FETs 910a can control the gain of the RF input signal through the amplifying device 901a. The amplified signal is provided as the output of the amplifying section 1010. In an embodiment, the amplifying device 901a is implemented using FET 1005 and FET 1004 connected in a cascode configuration by coupling the RF input signal to the gate of the FET 1004, connecting the drain of the FET 1004 to the source of the FET 1005, and coupling the output of the FET 1005 to the inverted output. The use of a cascode configuration can provide benefit by increasing available signal gain, increasing the possible supply voltage, and reducing the AM/PM distortion that can be caused by the gate-drain capacitance of the FET 1004 relative to what might occur if the FET 1005 were omitted.

An optional bias resistor 1006 can be used to provide dc bias to amplifying device 901a. Use of a bias resistor to provide bias current to amplifying device 901a can provide benefit by introducing less parasitic capacitance than other bias methods, such as transistors operating as current sources. Optional load resistor 1003 can be used to generate an output voltage from a current provided by the amplifying device 901a. Alternately, a current from the amplifying device 901a may be used as the output, or other suitable load networks may be used to provide an output voltage from the amplifying device 901a.

The FETs 910a can be connected in series with one another so as to provide a variable resistance to the amplifying device 901a for adjusting the gain of the RF signal through amplifying device 901a. Bias resistors 912a can be used to isolate the gates of FETs 910a from one another, such as by connecting a different resistor 912a from each FET gate to a gain control voltage.

The amplifying section 1020 is similar to the amplifying section 1010, but operates on the opposite polarity RF input signal than does the amplifying section 1010. The amplifying section 1020 comprises an amplifying device 901b, FETs 910b, resistors 912b, an optional load resistor 1033, and an optional bias resistor 1036. A capacitor 904b represents an unwanted parasitic capacitance, which may be present in the circuit, an intentionally placed capacitance, or a combination of parasitic and intentionally placed capacitance.

The amplifying device 901b is configured to receive the inverted RF input signal and is coupled to FETs 910b so that the resistance of the FETs 910b can control the gain of the RF input signal through the amplifying device 901b. The amplified signal is provided as the output of amplifying section 1020. In an embodiment, the amplifying device 901b is implemented using FET 1035 and FET 1034 connected in a cascode configuration by coupling the RF input signal to the gate of the FET 1034, connecting the drain of the FET 1034 to the source of the FET 1035, and coupling the output of the FET 1035 to the non-inverted output. The use of a cascode configuration can provide benefit by increasing available signal gain, increasing the possible supply voltage, and reducing the AM/PM distortion that can be caused by the gate-drain capacitance of the FET 1034 relative to what might occur if the FET 1035 were omitted.

An optional bias resistor 1036 can be used to provide dc bias to amplifying device 901b. Use of a bias resistor to provide bias current to amplifying device 901b can provide benefit by introducing less parasitic capacitance than other bias methods, such as transistors operating as current sources. Optional load resistor 1033 can be used to generate an output voltage from a current provided by the amplifying device 901b. Alternately, a current from the amplifying device 901b may be used as the output, or other suitable load networks may be used to provide an output voltage from the amplifying device 901*b*.

The FETs 910*b* can be connected in series with one another so as to provide a variable resistance to the amplifying device 901*b* for adjusting the gain of the RF signal through amplifying device 901*b*. Bias resistors 912*b* can be used to isolate the gates of FETs 910*b* from one another, such as by connecting a different resistor 912*b* from each FET gate to a gain control voltage.

The capacitor 1030 is coupled between amplifying section 1010 and amplifying section 1020 so that its capacitance value can modify the relationship between the resistance of the FETs 910*a* and 910*b* and the phase of the gain through the amplifying devices 901*a* and 901*b* by modifying the impedance presented to the amplifying devices 901*a* and 901*b* by the combination of the capacitances 904*a* and 904*b*, capacitance 1030 and FETs 910*a* and 910*b*. In an embodiment, the capacitor 1030 can be adjustable to allow for compensation for manufacturing variation, for changes in operating frequency, for modifying optimal range of gains, or for other reasons.

Figure 11:
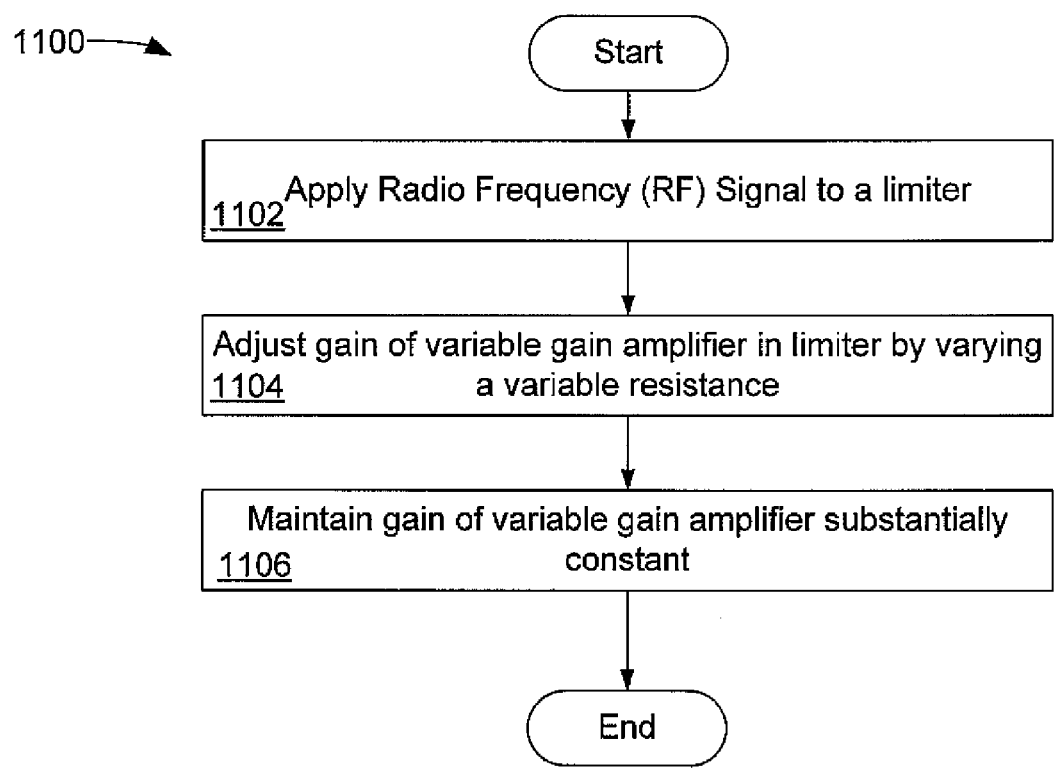
FIG. 11 is a flow chart illustrating the operation of an embodiment of a low distortion RF limiter.

FIG. 11 is a flow chart illustrating the operation of an embodiment of the low distortion RF limiter. The blocks in the flowchart can be performed in the order shown, out of the order shown, or can be performed in parallel. In block 1102, a radio frequency RF signal is applied to a limiter. In block 1104, the gain of a variable gain amplifier in the limiter is adjusted by controllably varying a variable resistance associated with the variable gain amplifier. In block 1106, the gain of the variable gain amplifier is maintained substantially constant, thereby minimizing AM/PM distortion applied by the limiter.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A limiter for minimizing an amount of phase change caused by input amplitude variations, comprising:
    a differential variable gain amplifier comprising a first amplifying section and a second amplifying section, the first amplifying section having a first amplifying device configured to receive a first portion of a differential signal having an amplitude component and a phase component and having a gain controlled by a first compensation capacitance and a first variable resistance, in which the first compensation capacitance minimizes an effect of parasitic capacitance in the first amplifying section and the first variable resistance adjusts a first gain portion in the first amplifying section, the second amplifying section having a second amplifying device configured to receive a second portion of the differential signal and having a gain controlled by the second compensation capacitor and a second variable resistance, in which the second compensation capacitance minimizes an effect of parasitic capacitance in the second amplifying section and the second variable resistance adjusts a second gain portion in the second amplifying section, wherein the amplitude component at an output of the differential variable gain amplifier remains substantially constant in response to a combined adjustment of the first gain portion and the second gain portion;
    wherein the first variable resistance comprises a first plurality of series-connected transistor devices and a first plurality of corresponding resistors, each transistor device of the first plurality of series-connected transistor devices having a gate terminal coupled to a first terminal of a corresponding resistor of a first plurality of corresponding resistors, a first portion of the gain of the differential variable gain amplifier adjustable through a control terminal coupled to a second terminal of each corresponding resistor; and
    wherein the second variable resistance comprises a second plurality of series-connected transistor devices and a second plurality of corresponding resistors, each transistor device of the second plurality of series-connected transistor devices having a gate terminal coupled to a first terminal of a corresponding resistor of the second plurality of corresponding resistors, a second portion of the gain of the differential variable gain amplifier adjustable through a control terminal coupled to a second terminal of each corresponding resistor.

2. The limiter of claim 1, in which at least one of the first and second the compensation capacitances is configured to modify the relationship between the resistance of at least one of the first and second variable resistances and a phase of the gain through the variable gain amplifier.

3. A method for minimizing an amount of phase change caused by amplitude variations, comprising:
    providing a first portion of a differential signal having amplitude modulation (AM) and phase modulation (PM) to a first amplifying portion of a differential variable gain amplifier having a first amplification device and a first variable resistance;
    coupling the first amplification device to a first compensation capacitance and the first variable resistance, in which the first compensation capacitance minimizes an effect of a parasitic capacitance in the first amplifying section and the first variable resistance adjusts a first gain portion in the first amplifying section;
    providing a second portion of the differential signal to a second amplifying portion of the differential variable gain amplifier having a second amplification device and a second variable resistance;
    coupling the second amplification device to a second compensation capacitance and the second variable resistance, in which the second compensation capacitance minimizes an effect of a parasitic capacitance in the second amplifying section and the second variable resistance adjusts a second gain portion in the second amplifying section;
    wherein the first variable resistance comprises a first plurality of series-connected transistor devices and a first plurality of corresponding resistors, each transistor device of the first plurality of series-connected transistor devices having a gate terminal coupled to a first terminal of a corresponding resistor of the first plurality of corresponding resistors, a first portion of the gain of the differential variable gain amplifier adjustable through a control terminal coupled to a second terminal of each corresponding resistor;
    wherein the second variable resistance comprises a second plurality of series-connected transistor devices and a second plurality of corresponding resistors, each transistor device of the second plurality of series-connected transistor devices having a gate terminal coupled to a first terminal of a corresponding resistor of the second plurality of corresponding resistors, a second portion of the gain of the differential variable gain amplifier adjustable through a control terminal coupled to a second terminal of each corresponding resistor; and wherein the amplitude modulation at an output of the differential variable gain amplifier is substantially removed in response to a combined adjustment of the first gain portion and the second gain portion.

4. The method of claim 3, further comprising varying the gain of at least one of the first and second variable resistances to adjust the gain of the differential variable gain amplifier.

5. The method of claim 4, further comprising modifying the relationship between the resistance of at least one of the first and second variable resistances and a phase of the gain through the differential variable gain amplifier.

6. The method of claim 5, in which adjusting the gain of the differential variable gain amplifier minimizes AM/PM distortion at a resistance value within the range of the first and second variable resistances.

7. A portable transceiver having a system for minimizing an amount of phase change caused by amplitude variations, comprising:
a transmitter coupled to a receiver;
a power amplifier associated with the transmitter, the power amplifier having a linear control characteristic, the power amplifier configured to amplify a phase-modulated (PM) signal according to the value of an amplitude-modulation (AM) control signal;
a feedback signal taken from the power amplifier;
a limiter configured to receive the feedback signal, the limiter comprising:
a differential variable gain amplifier comprising a first amplifying section and a second amplifying section, the first amplifying section having a first amplifying device configured to receive a first portion of a differential signal having an amplitude component and a phase component and having a gain controlled by a first compensation capacitance and a first variable resistance, in which the first compensation capacitance minimizes an effect of parasitic capacitance in the first amplifying section and the first variable resistance adjusts a first gain portion in the first amplifying section, the second amplifying section having a second amplifying device configured to receive a second portion of the differential signal and having a gain controlled by the second compensation capacitor and a second variable resistance, in which the second compensation capacitance minimizes an effect of parasitic capacitance in the second amplifying section and the second variable resistance adjusts a second gain portion in the second amplifying section, wherein the amplitude component at an output of the differential variable gain amplifier remains substantially constant in response to a combined adjustment of the first gain portion and the second gain portion;
wherein the first variable resistance comprises a first plurality of series-connected transistor devices and a first plurality of corresponding resistors, each transistor device of the first plurality of series-connected transistor devices having a gate terminal coupled to a first terminal of a corresponding resistor of a first plurality of corresponding resistors, a first portion of the gain of the differential variable gain amplifier adjustable through a control terminal coupled to a second terminal of each corresponding resistor; and
wherein the second variable resistance comprises a second plurality of series-connected transistor devices and a second plurality of corresponding resistors, each transistor device of the second plurality of series-connected transistor devices having a gate terminal coupled to a first terminal of a corresponding resistor of the second plurality of corresponding resistors, a second portion of the gain of the differential variable gain amplifier adjustable through a control terminal coupled to a second terminal of each corresponding resistor.

8. The portable transceiver of claim 7, in which at least one of the first and second compensation capacitances is configured to modify the relationship between the resistance of at least one of the first and second variable resistances and a phase of the gain through the differential variable gain amplifier.

* * * * *